US008102217B2

(12) United States Patent
Aoki

(10) Patent No.: US 8,102,217 B2
(45) Date of Patent: Jan. 24, 2012

(54) OSCILLATOR HAVING FEEDBACK PATH WHICH IS CAPABLE OF SUPPLYING REDUCED VOLTAGE POTENTIAL TO OSCILLATION CIRCUIT

(75) Inventor: Hiroyuki Aoki, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 64 days.

(21) Appl. No.: 12/591,725

(22) Filed: Nov. 30, 2009

(65) Prior Publication Data

US 2010/0134197 A1 Jun. 3, 2010

(30) Foreign Application Priority Data

Dec. 3, 2008 (JP) ................................ 2008-308708

(51) Int. Cl.
*H03B 5/32* (2006.01)
*H03L 1/00* (2006.01)

(52) U.S. Cl. ......... 331/160; 331/158; 331/172; 331/186

(58) Field of Classification Search .................. 331/158, 331/160, 172–174, 185, 186
See application file for complete search history.

(56) References Cited

U.S. PATENT DOCUMENTS 4,623,852 A * 11/1986 Abou et al. .................. 331/111
6,191,661 B1 * 2/2001 Tsukagoshi et al. .......... 331/158
7,138,881 B2 * 11/2006 Lin .............................. 331/158
7,859,353 B2 * 12/2010 Liu et al. ...................... 331/160

FOREIGN PATENT DOCUMENTS

JP 3136600 12/2000

* cited by examiner

*Primary Examiner* — Levi Gannon
(74) *Attorney, Agent, or Firm* — McGinn IP Law Group, LLC

(57) ABSTRACT

An oscillator creates a reference voltage based on a pulse signal corresponding to an oscillation output of a crystal oscillation circuit and controls a supply voltage to the crystal oscillation circuit according to the reference voltage. A control signal creating circuit creates a control signal based on the pulse signal and reference voltage generating circuits that control the reference voltage based on the control signal. The control signal creating circuit creates a low-level control signal when the pulse signal is in a low level, creates a high-level control signal when the pulse signal is in a high level, and prevents transition of the control signal from the high level to the low level.

5 Claims, 6 Drawing Sheets

VD
7
VREF
4 AMPLIFIER CIRCUIT
ED
1
CRYSTAL OSCILLATION CIRCUIT
SO
SP
2 LEVEL DETECTION CIRCUIT
VS
8
SP1
SP2
QP
QN
QP1
QN1
QN2
13
C1
14
VS
15
VS
16
VS
17

VD
4 AMPLIFIER CIRCUIT
ED
1
CRYSTAL OSCILLATION CIRCUIT
SO
2 LEVEL DETECTION CIRCUIT
SP
VS
7
VREF
QP1
QN1
QN2
17
QP
QN
16
SP2
8
SP1
C1
13
14
15

VD
SP
2 LEVEL DETECTION CIRCUIT
SO
1
CRYSTAL OSCILLATION CIRCUIT
ED
VS
4 AMPLIFIER CIRCUIT
+
-
9
QP2
VREF
7
QP
QN
16
VS
SP2
8
SP1
14
15
C1
VS
13

OSCILLATOR HAVING FEEDBACK PATH WHICH IS CAPABLE OF SUPPLYING REDUCED VOLTAGE POTENTIAL TO OSCILLATION CIRCUIT

INCORPORATION BY REFERENCE

This application is based upon and claims the benefit of priority from Japanese Patent Application No. 2008-308708 which was filed on Dec. 3, 2008, the disclosure of which is incorporated herein in its entirety by reference.

BACKGROUND OF THE INVENTION

1. Field of the Invention

The present invention relates to a feedback-type oscillation circuit, and particularly, to power consumption reduction.

2. Description of Related Art

In recent years, reduction in power consumption is an issue in a feedback-type oscillation circuit mounted on a semiconductor device. However, since the amplitude of an oscillation signal outputted upon the activation of an oscillation circuit is usually small, if the voltage level of a supplied power source voltage is reduced, then there is a problem that the amplitude of the oscillation signal cannot be grown in a short time.

A solution of the problem is proposed in Patent Document such as Japanese Patent No. 3136600).

FIG. 5 shows a low power consumption-type oscillation circuit described in the Patent Document.

A circuit shown in FIG. 5 includes a crystal oscillation circuit 1, a level detection circuit 2, an amplifier circuit 4, and a reference voltage generating circuit 6. The reference voltage generating circuit 6 is constituted by a low-pass filter 3, a switched capacitor circuit 5, a constant current source 7, a PMOS transistor QP, and an NMOS transistor QN. Furthermore, the switched capacitor circuit 5 is constituted by an inverter 12, a discharge switch 10, a charge switch 11, and a capacitive element C.

There are a case that a signal SP inputted to the reference voltage generating circuit 6 is a pulse signal at a constant frequency and a case that a fixed signal in a constant voltage level is inputted. At this point, in each case, the voltage level of signal outputted from the reference voltage generating circuit 6 is different. Therefore, for convenience, the reference voltage generating circuit 6 will be referred to as a "frequency-voltage conversion circuit 6" in the description. Furthermore, the low power consumption-type oscillation circuit shown in FIG. 5 includes a power source voltage terminal VD and a ground voltage terminal VS. For convenience, the symbols "VD" and "VS" denote terminal names, respectively, and at the same time, denote a power source voltage and a ground voltage.

Operations of the circuits shown in FIG. 5 will be described. An oscillation signal SO outputted from the crystal oscillation circuit 1 is inputted to the level detection circuit 2. Here, the level detection circuit 2 includes a Schmitt circuit that detects the amplitude level of the inputted oscillation signal. The signal SP outputted from the level detection circuit 2 is inputted to the frequency-voltage conversion circuit 6. Then, the frequency-voltage conversion circuit 6 outputs a reference voltage VREF. The reference voltage VREF is inputted to a non-inverting input terminal of the amplifier circuit 4. The voltage outputted from the amplifier circuit 4 is inputted to an inverting input terminal of the amplifier circuit 4 and a power source voltage terminal on the high-potential side of the crystal oscillation circuit 1. Meanwhile, the ground voltage VS is inputted to a power source voltage terminal on the low-potential side of the crystal oscillation circuit 1.

Here, an operation of the Schmitt circuit included in the level detection circuit 2 will be described. The oscillation signal SO outputted from the crystal oscillation circuit 1 is inputted to the level detection circuit 2. When the amplitude of the oscillation signal SO reaches a hysteresis width VSMT controlled by the Schmitt circuit, the level detection circuit 2 outputs the pulse signal SP.

At this point, to maintain the oscillation of the oscillation signal SO outputted from the crystal oscillation circuit 1, the hysteresis width VSMT of the Schmitt circuit needs to be adjusted. It is assumed here that a threshold voltage of the PMOS transistor QP is VTP and a threshold voltage of the NMOS transistor QN is VTN. In this case, a level detection value VSMT is usually adjusted to a voltage level of about $|VTP|+VTN$.

A configuration and an operation of the frequency-voltage conversion circuit 6 will be described. The pulse signal SP outputted from the level detection circuit 2 is inputted to the switched capacitor circuit 5 included in the frequency-voltage conversion circuit 6. The pulse signal is inputted to the charge switch 11 as a control signal. The pulse signal is also inputted to the inverter 12. A signal (inversion signal of the pulse signal SP) outputted from the inverter 12 is inputted to the discharge switch 10 as a control signal. Thus, the discharge switch 10 and the charge switch 11 switch ON/OFF of the connection, respectively, in accordance with the control signals in different voltage levels.

By the way, one terminal of the discharge switch 10 is connected to the ground voltage terminal VS. The other terminal of the discharge switch 10 is connected to one terminal of the capacitive element C and one end of the charge switch. The other terminal of the capacitive element C is connected to the ground voltage terminal VS.

The power source voltage VD is applied to an input terminal of the constant current source 7. As a result, a signal with a constant current value IS is outputted from an output terminal of the constant current source 7. By the way, an output terminal of the constant current source 7 is connected to a node D. Additionally, the node D is connected to the other terminal of the charge switch 11, a source of the PMOS transistor QP, and an input terminal of the low-pass filter 3. Four terminals, a drain and a gate of the PMOS transistor QP and a drain and a gate of the NMOS transistor QN, are connected to each other. A source of the NMOS transistor QN is connected to the ground voltage terminal VS. The low-pass filter 3 outputs the reference voltage VREF.

When the low-level fixed signal SP is outputted from the level detection circuit 2, the connection of the charge switch 11 included in the switched capacitor circuit 5 becomes OFF. Thus, only the output terminal of the constant current source 7, the source of the PMOS transistor QP, and the input terminal of the low-pass filter 3 are connected to the node D. Here, a potential VDO (hereinafter, referred to as a drain voltage VDO) of the node D can be illustrated with Expression (1).

$$VDO = VTP + \sqrt{\frac{2IS}{\beta p}} + VTN + \sqrt{\frac{2IS}{\beta n}} \quad (1)$$

$$\beta p = \mu p \cdot Cox \cdot \left(\frac{Wp}{Lp}\right)$$

$$\beta n = \mu n \cdot Cox \cdot \left(\frac{Wn}{Ln}\right)$$

Here, μp and μn denote the mobility of hole and electron, respectively. Furthermore, (Wp/Lp) and (Wn/Ln) denote ratios of "channel width/channel length" of the transistors QP and QN, respectively. Cox denotes a gate oxide film capacitance per unit area.

To reduce power consumption, the constant current IS outputted from the constant current source 7 is adjusted to a minute value. Meanwhile, the reference voltage VREF outputted from the low-pass filter 3 denotes a voltage value VRH. The drain voltage VDO also denotes the voltage value VRH. At this point, the drain voltage VDO is adjusted to a voltage level close to the power source voltage VD. To satisfy such a condition, the values of the second term and the fourth term on the right side need to be increased in Expression (1). Thus, the ratios of "channel width/channel length" of the transistors QP and QN need to be decreased.

Next, when the pulse signal SP is outputted from the level detection circuit 2 as the amplitude of the oscillation signal SO outputted from the crystal oscillation circuit 1 increases, the connection of the charge switch 11 included in the switched capacitor circuit 5 becomes ON. Furthermore, the connection of the discharge switch 10 becomes OFF. Thus, the output terminal of the constant current source 7, the source of the PMOS transistor QP, the input terminal of the low-pass filter 3, and one terminal of the capacitive element C are connected to the node D. Assuming that the current value flowing though the capacitive element C is IC, a current IC=C·VDO·f (f denotes a frequency of the pulse signal SP, and C denotes a capacitance value of the capacitive element C) flows. Thus, since the current IC in the constant current IS shunts to the ground voltage VS, the voltage value of the drain voltage VDO decreases.

At this point, the constant current value IS and the capacitance value C are adjusted so that the voltage value VRL of the reference voltage VREF outputted from the low-pass filter 3 becomes about |VTP|+VTN. Here, the low-pass filter 3 integrates and removes the ripple components generated by the switching and outputs only direct current components as the reference voltage VREF.

The reference voltage VREF outputted from the frequency-voltage conversion circuit 6 is inputted to the non-inverting input terminal of the amplifier circuit 4. Then, the reference voltage VREF is amplified by the amplifier circuit 4 with voltage gain 1 and outputted as the power source voltage ED. The power source voltage ED is inputted to the power source voltage terminal on the high-potential side of the crystal oscillation circuit 1.

Next, a timing chart shown in FIG. 6 will be described. FIG. 6 shows a timing chart of a low power consumption-type oscillation circuit described in Patent Document.

First, in a case before a time tO, the amplitude of the oscillation signal SO outputted from the crystal oscillation circuit 1 is equal to or less than the level detection value VSMT of the level detection circuit 2. Therefore, the level detection circuit 2 outputs the low-level fixed signal SP.

At this point, the connection of the charge switch 11 becomes OFF. Therefore, the reference voltage VREF outputted from the low-pass filter 3 indicates a value close to the power source voltage VD. Thus, the value of the power source voltage ED inputted to the power source voltage terminal on the high-potential side of the crystal oscillation circuit 1 is also close to the power source voltage VD. In this way, using a voltage level close to the power source voltage VD upon the activation of the oscillation circuit can quickly start up the oscillation amplitude.

Next, at the time tO, the amplitude of the oscillation signal SO outputted from the crystal oscillation circuit 1 reaches the level detection value VSMT of the level detection circuit 2. Therefore, after the time tO, the level detection circuit 2 outputs the pulse signal SP at the same frequency as the frequency of the oscillation signal SO.

At this point, the connection of the charge switch 11 repeats ON/OFF according to the frequency of the pulse signal SR Therefore, the reference voltage VREF outputted from the frequency-voltage conversion circuit 6 decreases to the sum of the threshold voltages |VTP|+VTN. The reference voltage VREF decreased to the voltage value VRL is amplified by the amplifier circuit 4 with voltage gain 1 and outputted as the power source voltage ED. Thus, the power source voltage ED inputted to the power source voltage terminal on the high-potential side of the level detection circuit 2 also indicates the voltage value VRL (about |VTP|+VTN). In this way, when the level detection circuit 2 outputs the pulse signal SP at a constant frequency, limiting the supply of the power source voltage can reduce the power consumption.

By the way, when the reference voltage VREF is reduced to the voltage value VRL, to continue outputting the pulse signal SP from the level detection circuit 2, the level detection value VSMT needs to be set lower than the voltage value VRL.

However, in the technique described in Patent Document, ON/OFF of the switches 10 and 11 included in the switched capacitor circuit 5 are repeated according to the pulse signal SP outputted from the level detection circuit 2. Therefore, the drain voltage VDO upon charging (the charge switch 11 is ON) and the drain voltage VDO upon discharging (the charge switch 11 is OFF) are different, and the drain voltage VDO swings.

In such a case, unless the low-pass filter 3 is used, the power source voltage ED outputted from the amplifier circuit 4 also swings. In this case, if the power source voltage ED decreases below the oscillation maintenance voltage of the crystal oscillation circuit 1, then the oscillation of the oscillation signal SO outputted from the crystal oscillation circuit 1 terminates. To prevent the problem, the lower limit voltage of the power source voltage ED needs to be adjusted higher than the oscillation maintenance voltage of the crystal oscillation circuit 1. However, even if the lower limit voltage of the drain voltage VDO is simply adjusted higher, the reduction effect of the power consumption is small.

Therefore, the low-pass filter 3 is used. Using the low-pass filter 3 can make the amplitude small before outputting the drain voltage VDO. As a result, the lower limit voltage of the power source voltage ED can be adjusted higher than the oscillation maintenance voltage of the crystal oscillation circuit 1. However, there is a problem that the area increases if the low-pass filter is used. Furthermore, there is a problem that the area of the low-pass filter significantly increases when the oscillation frequency is low.

SUMMARY

An oscillator of an exemplary aspect creates a reference voltage (for example, a voltage of a node VREF) based on a pulse signal (for example, a signal SP) corresponding to an oscillation output of an oscillation circuit (for example, a crystal oscillation circuit 1) and that controls a maximum voltage level (for example, a voltage ED) of the oscillation circuit according to the reference voltage. The oscillator includes a control signal creating circuit (for example, a control signal creating circuit 15) that creates a first reference voltage control signal (for example, a low-level signal SP2) and a second reference voltage control signal (for example, a high-level signal SP2) based on the pulse signal; and a reference voltage generating circuit (for example, reference voltage generating circuits 16 and 17) that creates a first reference voltage (for example, a voltage VH) when the first reference voltage control signal created by the control signal creating circuit is inputted and that creates a second reference voltage (for example, a voltage VL) lower than the first reference voltage when the second reference voltage control signal is inputted, wherein the control signal creating circuit creates the first reference voltage control signal when the pulse signal is in a first logic level (for example, a low level), creates the second reference voltage control signal when the pulse signal is in a second logic level (for example, a high level) different from the first logic level, and prevents transition from the second reference voltage control signal to the first reference voltage control signal when the pulse signal changes from the second logic level to the first logic level.

With the characteristics described above, the voltage supplied to the oscillation circuit does not swing without using a low-pass filter. Therefore, the power consumption can be reduced without significantly increasing the area.

The present invention can provide an oscillator that can reduce power consumption without significantly increasing the area.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

Exemplary Embodiment 1

Figure 1:
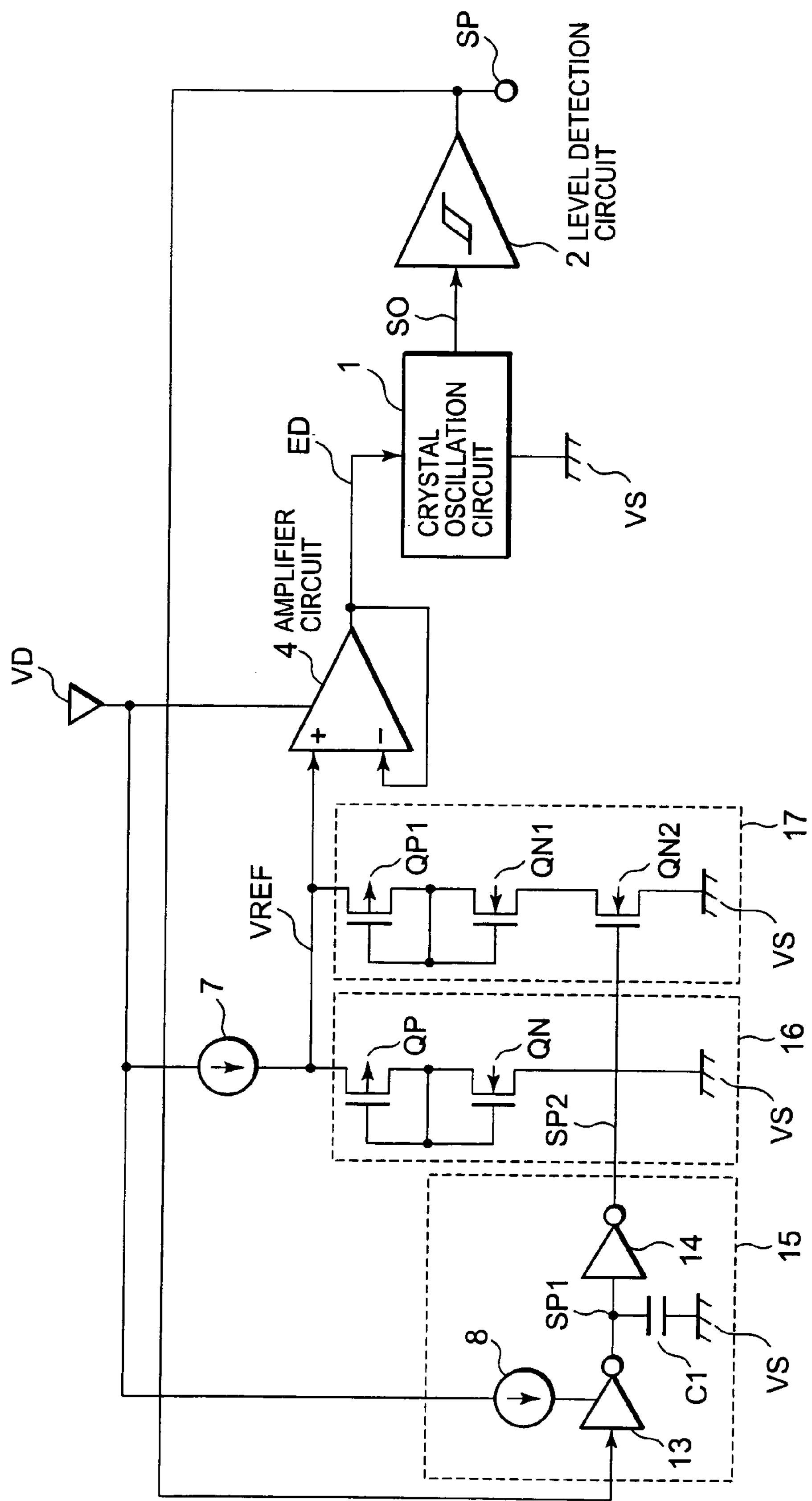
FIG. 1 is a diagram showing an oscillator according to an exemplary embodiment 1 of the present invention.

FIG. 1 shows an oscillator according to an exemplary embodiment 1 of the present invention. The circuit includes a crystal oscillation circuit 1, a level detection circuit 2 including a Schmitt circuit that detects an amplitude level of an oscillation output signal SO, a control signal creating circuit 15, a reference voltage generating circuit a (first reference voltage generating circuit) 16, a reference voltage generating circuit b (second reference voltage generating circuit) 17, a constant current source (first constant current source) 7, an amplifier circuit 4, a power source voltage terminal VD, and a ground voltage terminal VS. For convenience, symbols "VD", "VS", and "C1" denote terminal names or element names, respectively, and at the same time, denote a power source voltage, a ground voltage, and a capacitance value.

The control signal creating circuit 15 includes a constant current source (current control circuit) 8, an inverter (first gate) 13, an inverter (second gate) 14, and a capacitive element (first capacitive element) C1. The control signal creating circuit 15 has a function of outputting a control signal to the reference voltage generating circuit b 17 according to a signal SP outputted from the level detection circuit 2. The reference voltage generating circuit a 16 includes a PMOS transistor QP as a threshold voltage VTP and an NMOS transistor QN as a threshold voltage VTN. The reference voltage generating circuit a 16 has a function of controlling a voltage (hereinafter, referred to as reference voltage VREF) of a node VREF (reference voltage terminal VREF) when the signal SP outputted from the level detection circuit 2 outputs a fixed signal.

The reference voltage generating circuit b 17 includes a PMOS transistor QP 1 including a channel length Lp1 shorter than a channel length Lp of the PMOS transistor QP, an NMOS transistor QN1 including a channel length Ln1 shorter than a channel length Ln of the NMOS transistor QN, and an NMOS transistor QN2. Here, the reference voltage generating circuit b 17 has a function of controlling the reference voltage VREF when the signal SP outputted from the level detection circuit 2 outputs a pulse signal.

First, an output terminal of the crystal oscillation circuit 1 is connected to an input terminal of the level detection circuit 2. An output terminal of the level detection circuit 2 is connected to an external output terminal SP and an input terminal of the inverter 13 included in the control signal creating circuit 15. An output terminal of the inverter 13 is connected to an input terminal of the inverter 14 and one terminal of the capacitive element C1. The other terminal of the capacitive element C1 is connected to the ground voltage terminal VS. An input terminal of the constant current source 8 is connected to the power source voltage terminal VD. An output terminal of the constant current source 8 is connected to a power source voltage terminal on the high-potential side of the inverter 13. An output terminal of the inverter 14 is connected to a gate of the NMOS transistor QN2 included in the reference voltage generating circuit b 17.

An input terminal of the constant current source 7 is connected to the power source voltage terminal VD. An output terminal of the constant current source 7 is connected to the node VREF. Additionally, the node VREF is connected to a source of the PMOS transistor QP included in the reference voltage generating circuit a 16, a source of the PMOS transistor QP1 included in the reference voltage generating circuit b 17, and a non-inverting input terminal of the amplifier circuit 4. In the reference voltage generating circuit a 16, four terminals, a drain and a gate of the PMOS transistor QP and a drain and a gate of the NMOS transistor QN, are connected to each other. A source of the NMOS transistor QN is connected to the ground voltage terminal VS. In the reference voltage generating circuit b 17, four terminals, a drain and a gate of the PMOS transistor QP1 and a drain and a gate of the NMOS transistor QN1 are connected. A source of the NMOS transistor QN1 is connected to the drain of the NMOS transistor QN2. A source of the NMOS transistor QN2 is connected to the ground voltage terminal VS.

A power source voltage terminal on the high-potential side of the amplifier circuit 4 is connected to the power source voltage terminal VD. An output terminal of the amplifier circuit 4 is connected to an inverting input terminal of the amplifier circuit 4 and a power source voltage terminal on the high-potential side of the crystal oscillation circuit 1. A power source voltage terminal on the low-potential side of the crystal oscillation circuit 1 is connected to the ground voltage terminal VS.

Next, an operation of the circuit shown in FIG. 1 will be described. First, the signal SO outputted from the crystal oscillation circuit 1 is inputted to the input terminal of the level detection circuit 2. The signal SP outputted from the level detection circuit 2 is inputted to the external output terminal SP and the input terminal of the inverter 13 included in the control signal creating circuit 15. The signal SP1 outputted from the inverter 13 is inputted to the input terminal of the inverter 14 and one terminal of the capacitive element C1. The power source voltage VD is applied to the input terminal of the constant current source 8. Then, a signal of a constant current is outputted from the output terminal of the constant current source 8. A signal outputted from the constant current source 8 is inputted to the power source voltage terminal on the high-potential side of the inverter 13. The signal SP2 outputted from the inverter 14 is inputted to the gate of the NMOS transistor QN2 included in the reference voltage generating circuit b 17.

The power source voltage VD is applied to the input terminal of the constant current source 7. Then, a signal of the constant current IS is outputted from the output terminal of the constant current source 7. The signal outputted from the constant current source 7 is inputted to the source of the PMOS transistor QP included in the reference voltage generating circuit a 16, the source of the PMOS transistor QP1 included in the reference voltage generating circuit b 17, and the non-inverting input terminal of the amplifier circuit 4 through the node VREF. The power source voltage VD is applied to the power source voltage terminal on the high-potential side of the amplifier circuit 4. Then, the signal ED outputted from the amplifier circuit 4 is inputted to the inverting input terminal of the amplifier circuit 4 and the power source voltage terminal on the high-potential side of the crystal oscillation circuit 1.

Figure 2:
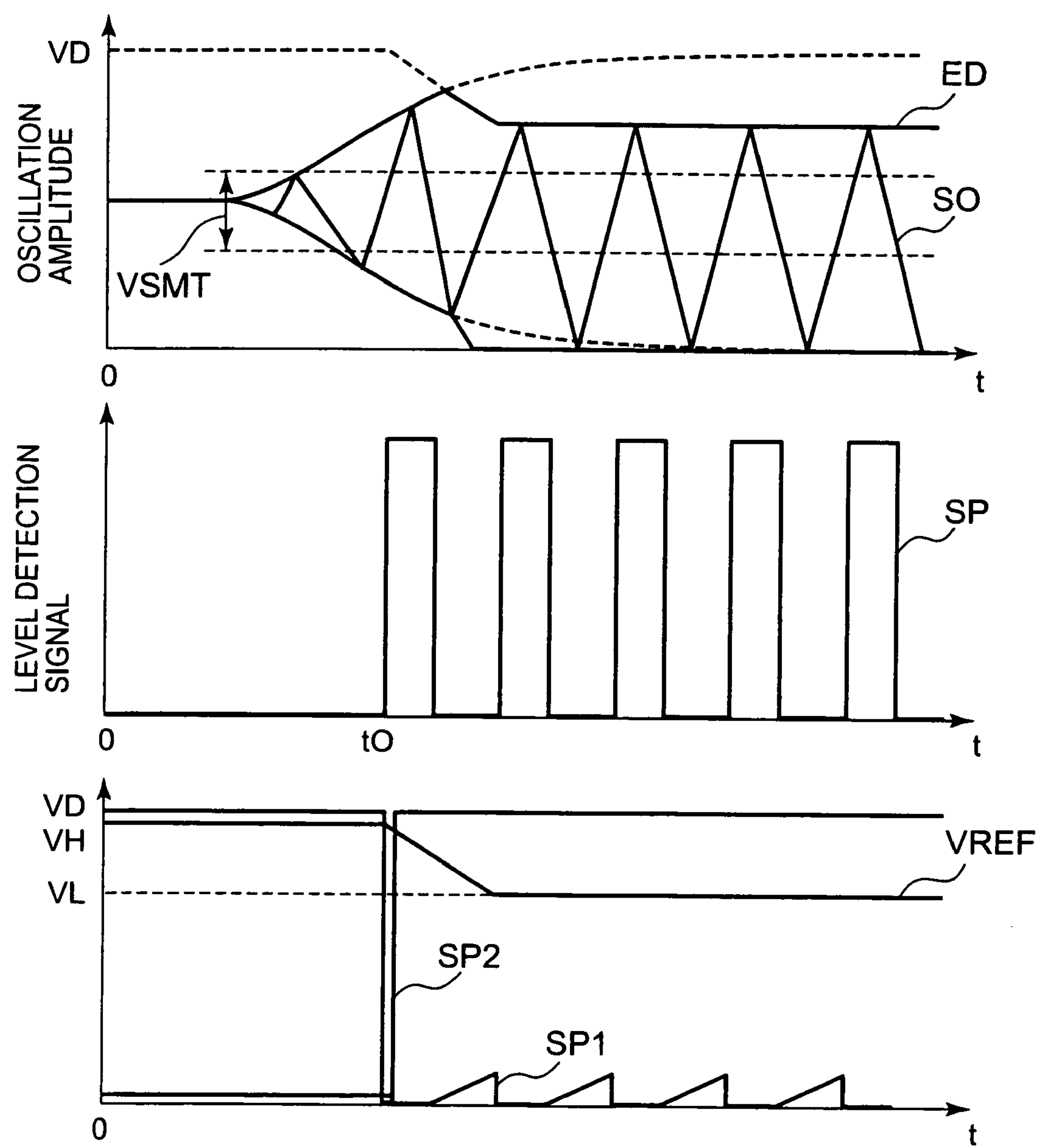
FIG. 2 is a diagram showing a timing chart of the oscillator according to the exemplary embodiment 1 of the present invention.

FIG. 2 shows a timing chart of the oscillator according to the exemplary embodiment 1 of the present invention. In a case before a time tO, the amplitude of the oscillation signal SO outputted from the crystal oscillation circuit 1 is equal to or below a level detection value VSMT of the level detection circuit 2. Therefore, the low-level fixed signal SP is outputted from the level detection circuit 2. For convenience, the fixed signal outputted from the level detection circuit 2 before the time tO will be simply called a "fixed signal" SP. As a result, the high-level signal SP1 is outputted from the inverter 13, and the low-level signal SP2 is outputted from the inverter 14. Therefore, the NMOS transistor QN2 included in the reference voltage generating circuit b 17 is turned off. In this case, assuming that the voltage value of the reference voltage VREF is VH, the following expression can be obtained.

$$VH = VTP + \sqrt{\frac{2IS}{\beta p}} + VTN + \sqrt{\frac{2IS}{\beta n}} \tag{2}$$

$$\beta p = \mu p \cdot Cox \cdot \left(\frac{Wp}{Lp}\right)$$

$$\beta n = \mu n \cdot Cox \cdot \left(\frac{Wn}{Ln}\right)$$

Here, μp and μn denote the mobility of hole and electron, respectively. Furthermore, (Wp/Lp) and (Wn/Ln) denote ratios of "channel width/channel length" of the transistors QP and QN, respectively. Cox denotes a gate oxide film capacitance per unit area.

To reduce the power consumption, the constant current IS outputted from the constant current source 7 is adjusted to a minute value. Meanwhile, the voltage value VH of the reference voltage VREF is adjusted to a voltage level close to the power source voltage VD. To satisfy such a condition, the values of the second term and the fourth term on the right side need to be increased in Expression (2). Thus, the ratios of "channel width/channel length" of the transistors QP and QN need to be decreased.

At this point, the voltage value VH of the reference voltage VREF denotes a value close to the power source voltage VD. Thus, the value of the power source voltage ED inputted to the power source voltage terminal on the high-potential side of the crystal oscillation circuit 1 is also close to the power source voltage VD. In this way, using the high voltage level close to the power source voltage VD upon the activation of the oscillation circuit can quickly start up the oscillation amplitude.

Next, at the time tO, the amplitude of the oscillation signal SO outputted from the crystal oscillation circuit 1 reaches the level detection value VSMT of the level detection circuit 2. Therefore, after the time tO, the level detection circuit 2 outputs the pulse signal SP at the same frequency as the frequency of the oscillation signal SO. For convenience, a pulse signal at a constant frequency outputted from the level detection circuit 2 after the time tO will be simply called a "pulse signal" SP.

Here, a case that the high-level signal SP is outputted from the level detection circuit 2 at the time tO will be considered. When the high-level pulse signal SP is supplied to the control signal creating circuit 15, the low-level signal SP1 is outputted from the inverter 13, and the high-level signal SP2 is outputted from the inverter 14. Therefore, the NMOS transistor QN2 included in the reference voltage generating circuit b 17 turns on.

Next, a case that the pulse signal SP2 is consecutively outputted from the level detection circuit 2 after the time tO will be considered. First, when the pulse signal SP is in a high level, the low-level signal SP1 is outputted from the inverter 13, and the high-level signal SP2 is outputted from the inverter 14. Therefore, the NMOS transistor QN2 of the reference voltage generating circuit b 17 turns on. On the other hand, when the pulse signal SP is in a low level, the high-level signal SP1 is outputted from the inverter 13. At this point, the voltage level of the signal SP 1 outputted from the inverter 13 is controlled according to the constant current value IS1 supplied from the constant current source 8 and the capacitance value C1, and the voltage level increases at the rate of slope IS1/C1.

In this case, by adjusting the current value IS1 and the capacitance value C1, the voltage level of the signal SP1 outputted from the inverter 13 is prevented from exceeding the threshold voltage of the inverter 14 during the period that the pulse signal SP2 is indicating a high level. As a result, the inverter 14 continues outputting the high-level signal SP2 all the time. Thus, the NMOS transistor QN2 included in the reference voltage generating circuit b 17 is always in an on-state.

As described, even if the level detection circuit 2 consecutively outputs the pulse signal SP, the on-state of the NMOS transistor QN included in the reference voltage generating circuit b 17 is maintained. At this point, the gate voltage of the NMOS transistor QN2 is the power source voltage VD. In that case, increasing the channel width of the NMOS transistor QN2 and shortening the channel length can decrease the potential difference between the source and the drain to the extent that can be ignored. This can make the source voltage of the NMOS transistor QN1 equal to the ground voltage VS.

At this point, the reference voltage generating circuit b 17 is in a conductive state. Assuming that the voltage value of the reference voltage VREF is VL, Expression (3) can be obtained.

$$VL = VTP + \sqrt{\frac{2IS}{\beta p1}} + VTN + \sqrt{\frac{2IS}{\beta n1}} \quad (3)$$

$$\beta p1 = \mu p \cdot Cox \cdot \left(\frac{Wp}{Lp1}\right)$$

$$\beta n1 = \mu n \cdot Cox \cdot \left(\frac{Wn}{Ln1}\right)$$

Here, μp and μn denote the mobility of hole and electron, respectively. Furthermore, (Wp/Lp1) and (Wn/Ln1) denote ratios of "channel width/channel length" of the transistors QP1 and QN1, respectively. Cox denotes a gate oxide film capacitance per unit area.

In the reference voltage generating circuit b 17, the channel length Lp1 of the PMOS transistor QP1 and the channel length Ln1 of the NMOS transistor QN1 are set shorter than the channel length Lp of the PMOS transistor QP and the channel length Ln of the NMOS transistor QN of the reference voltage generating circuit a 16, respectively. Therefore, since the reference voltage generating circuit a 16 is substantially in a non-conductive state, Expression (3) is formed. Based on Expression (2) and Expression (3), comparing the voltage value VH of the reference voltage VREF before the time tO and the voltage value VL of the reference voltage VREF after the time tO, VH>VL.

The voltage value of the reference voltage VREF decreases to VL. Therefore, the amplifier circuit 4 supplies the voltage ED at the same voltage level as VL to the power source voltage terminal on the high-potential side of the crystal oscillation circuit 1. In this way, when the level detection circuit 2 starts outputting the pulse signal SP at a constant frequency, the supply of the power source voltage to the crystal oscillation circuit 1 is limited. Therefore, power consumption can be reduced.

By the way, to consecutively output the pulse signal SP from the level detection circuit 2 when the voltage value of the reference voltage VREF decreases to VL, the level detection value VSMT needs to be set lower than the voltage value VL.

Figure 5:
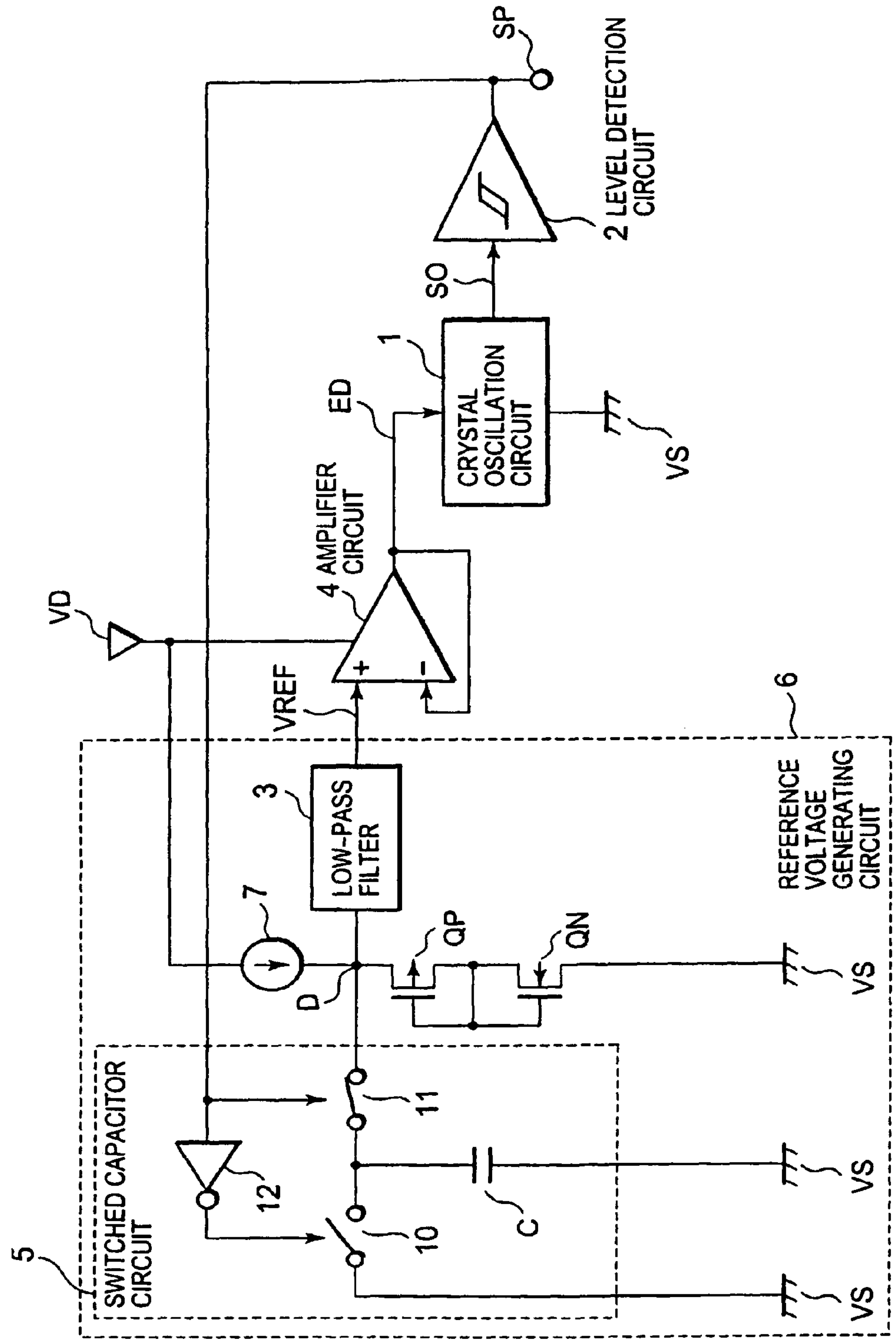
FIG. 5 is a diagram showing a low power consumption-type oscillation circuit of a technique of a related art.
Figure 6:
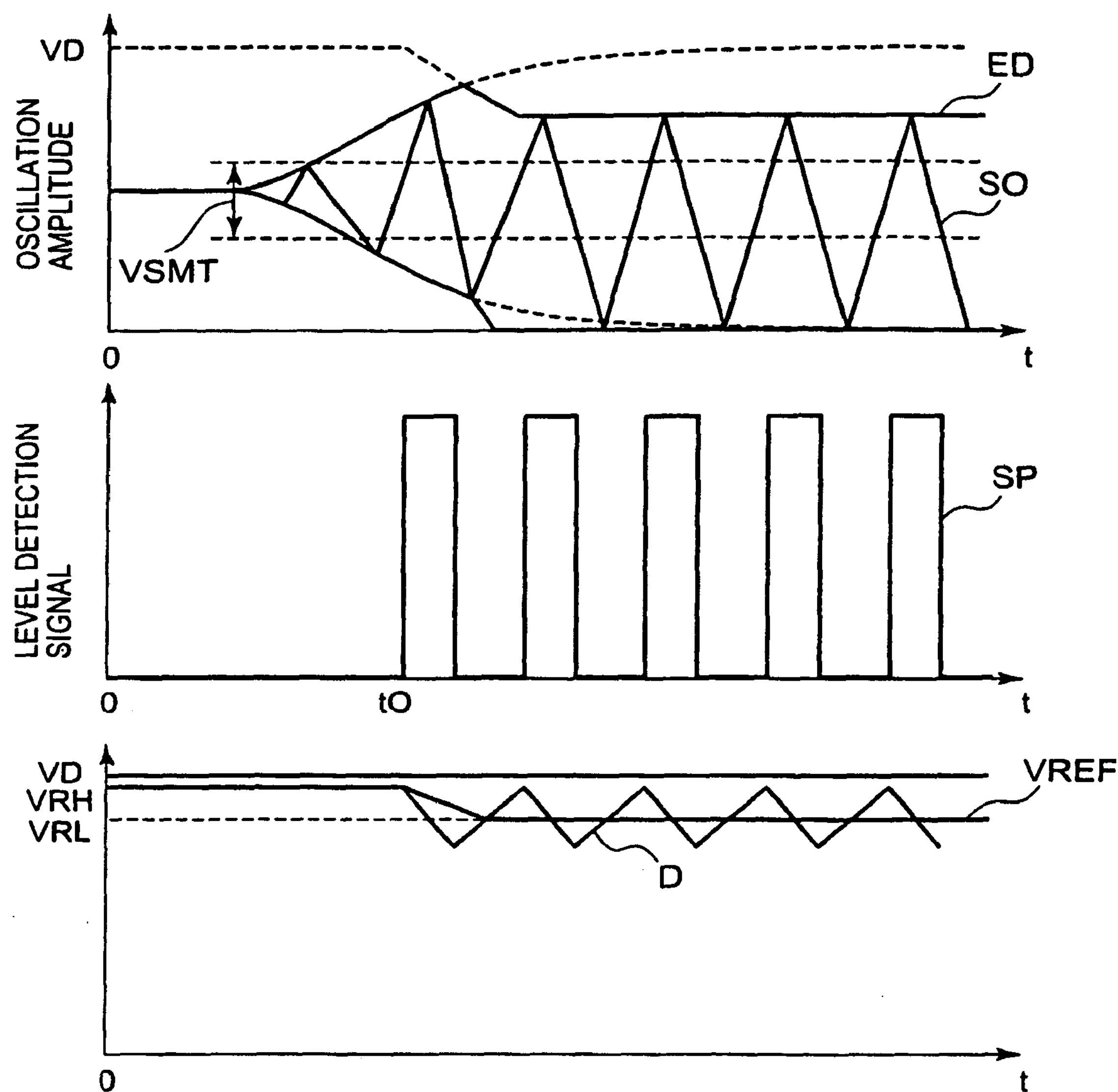
FIG. 6 is a diagram showing a timing chart of the low power consumption-type oscillation circuit of the technique.

In this way, in the oscillator according to the present invention, the reference voltage control signal SP2 is fixed to a constant voltage level upon the output of the fixed signal SP. Then, after the output of the pulse signal SP, the reference voltage control signal SP2 outputted after logical inversion from the control signal creating circuit 15 controls the reference voltage generating circuit b 17. As a result, upon the output of the fixed signal SP, the voltage level of the reference voltage VREF controlled by the reference voltage generating circuit a 16 can be changed. Furthermore, the reference voltage inputted to the non-inverting input terminal of the amplifier circuit 4 is controlled by the reference voltage control signal SP2 without amplitude. Thus, a stable reference voltage can be directly inputted to the amplifier circuit 4 without being affected by the voltage level of the pulse signal SP outputted from the level detection circuit 2. Therefore, the voltage does not swing as in the signal outputted from the switched capacitor circuit 5 of the technique shown in FIG. 5, and the low-pass filter is not necessary. As a result, the problem of the technique that the area increases can be solved.

Here, the area reduction effect in the oscillator according to the exemplary embodiment 1 of the present invention will be considered. First, the low-pass filter 3 used in the circuit of the technique shown in FIG. 5 can be illustrated with the following expression.

$$\frac{|VOUT|}{|VIN|} = \frac{1}{\sqrt{1 + (2 \cdot \pi \cdot f \cdot CL \cdot RL)^2}} \quad (4)$$

VOUT: output amplitude of the low-pass filter 3

VIN: input amplitude of the low-pass filter 3 f: input frequency of the low-pass filter 3 (oscillation frequency of the crystal oscillation circuit 1)

CL: capacitance in the low-pass filter 3

RL: resistance in the low-pass filter 3

When the oscillation frequency f is constant, if an attempt is made to attenuate the amplitude of the drain voltage VDO generated by the operation of the switched capacitor circuit 5, the product CL·RL of the low-pass filter 3 needs to be increased, and the area of the low-pass filter increases. The product CL·RL also needs to be increased when the oscillation frequency f is low, and the low-pass filter area increases.

For example, if the oscillation frequency f=33 KHz, and the amplitude of the reference voltage VREF relative to the drain voltage VDO is 1/100, based on the expression of the low-pass filter, then RL·CL=4.82×10^−1. Here, assuming that the sheet resistance of the resistance RL is 1 KΩ/□, the wiring width of the resistance RL is 1 um, and the capacitance per 1 um^2 of the capacitance CL is 1 fF, the combination of RL and CL that makes the total area of the resistance RL and the capacitance CL smallest is RL=1000 MΩ and CL=4.82×10^+5 ff. In this case, the total area of RL and CL is 1482000 um^2.

Furthermore, it is assumed that the current value of the constant current source 7 is 1 uA, and it is assumed that the voltage value VH of the reference voltage VREF upon the output of the fixed signal SP is 5 V and that the voltage value VL of the reference voltage VREF after the output of the pulse signal SP is 2.5 V. In this case, the current IC that shunts in the switched capacitor circuit 5 after the input of the pulse signal SP can be illustrated with the following expression.

$$IC = f \cdot C \cdot C \quad (5)$$

IC: current that shunts in the switched capacitor circuit 5 f: oscillation frequency

C: capacitance value of the capacitive element C included in the switched capacitor circuit 5

VC: difference between the voltage value VH of the reference voltage VREF upon the output of the fixed signal SP and the voltage value VL of the reference voltage VREF after the output of the pulse signal SP Since IC=0.5 uA, f=33 KHz, and VC=2.5 V, C=6.06 pF. Assuming that the unit capacity per 1 um^2 of the capacitive element C is 1 fF, the area of the capacitive element is 6060 um^2.

Assuming that the discharge switch 10, the charge switch 11, and the inverter 12 are constituted by MOS transistors, and their areas can be ignored, the sum of the area of the low-pass filter 3 and the area of the capacitance C of the switched capacitor circuit 5 is 1482000+6060=1488060 um^2.

On the other hand, the circuit of the exemplary embodiment 1 of the present invention shown in FIG. 1 will be considered. The control signal creating circuit 15 can be illustrated with the following expression.

$$I \cdot t = C1\,VT \tag{6}$$

I: current value of the constant current source 8 t: half cycle of the oscillation period

C1: capacitance value of the capacitive element C1 included in the control signal creating circuit 15

VT: threshold of the inverter 14

Here, when the half cycle of the oscillation frequency 33 KHz is t=15 us, if I=20 nA and VT=0.5 V, then C1=0.6 pF. As in the example of the conventional technique, assuming that the unit capacity per 1 um^2 of the capacitive element C1 is 1 fF, the area of the capacitive element C1 is 600 um^2.

When the constant current of 1 uA flows from the constant current source 7, it is assumed that the channel width W and the channel length L of the constant current source 7 are W=10 um and L=1 um, respectively. Furthermore, when the constant current of 20 nA flows from the constant current source 8, the channel length L of the constant current source 7 is 50 times, or L=50 um. Therefore, the area of the constant current source 8 is 500 um^2.

Furthermore, it is assumed that the channel width W and the channel length L of the PMOS transistor QP and the NMOS transistor QN are W=10 um and L=10 um, respectively, and it is assumed that the reference voltage VREF after the output of the pulse signal SP is decreased from 5 V to 2.5 V. In this case, the channel width W and the channel length L of the PMOS transistor QP1 and the NMOS transistor QN1 are W=10 um and L=5 um, respectively, and the sum of the areas of the PMOS transistor QP1 and the NMOS transistor QN1 is 10 um×5 um×2=100 um^2.

Assuming that the inverters 13, 14 and the NMOS transistor QN2 are constituted by MOS transistors, their areas can be ignored. The sum of the areas of the constant current source 8, the capacitive element C1, the PMOS transistor QP1, and the NMOS transistor QN1 is 600+500+100=1200 um^2. Since the sum of the area of the low-pass filter 3 included in the circuit of the conventional technique and the area of the capacitance C of the switched capacitor circuit 5 is 1488060 um^2, the area reduction effect of about 1480000 um^2 can be obtained.

Exemplary Embodiment 2

Figure 3:
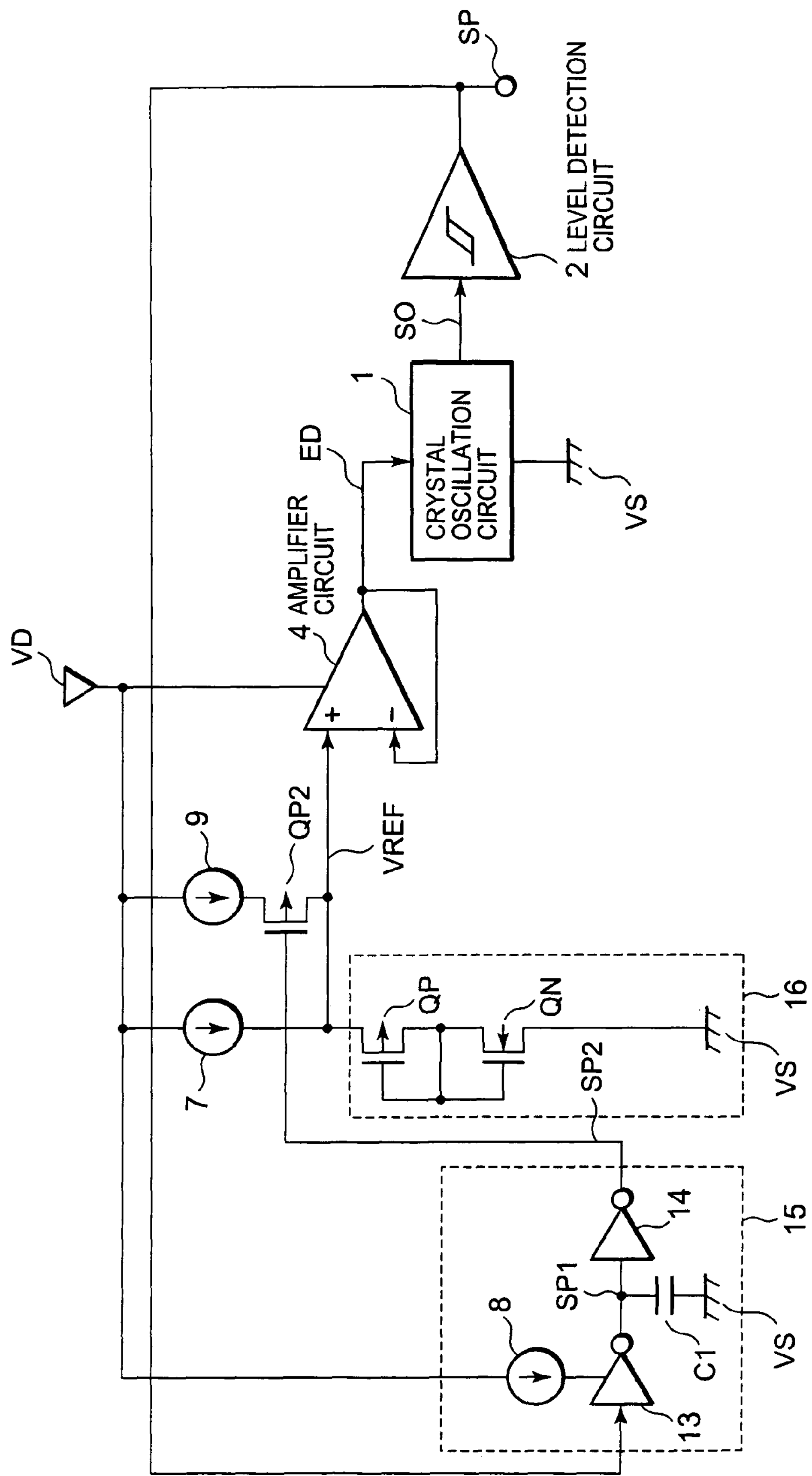
FIG. 3 is a diagram showing an oscillator according to an exemplary embodiment 2 of the present invention.

FIG. 3 shows an oscillator according to an exemplary embodiment 2 of the present invention. The circuit implements a circuit configuration in which the reference voltage generating circuit b 17 is deleted from the oscillator of the exemplary embodiment 1, and a constant current source (second constant current source) 9 and a PMOS transistor (switching element) QP2 are added. An input terminal of the constant current source 9 is connected to the power source voltage terminal VD. An output terminal of the constant current source 9 is connected to a source of the PMOS transistor QP2. A drain of the PMOS transistor QP2 is connected to the node VREF. An output terminal of the inverter 4 is connected to a gate of the PMOS transistor QP2. Other circuit configurations are the same as the exemplary embodiment 1.

Next, an operation of the circuit shown in FIG. 3 will be described. Operations of from the oscillation termination state to the oscillation start of the crystal oscillation circuit 1, the level detection circuit 2, and the control signal creating circuit 15 are the same as in the exemplary embodiment 1. It is assumed that the constant current value of the constant current source 7 is IS and the constant current value of the constant current source 9 is IS2.

Upon the output of the fixed signal SP, or when the low-level fixed signal SP is outputted from the level detection circuit 2, the control signal creating circuit 15 outputs the low-level signal SP2. Therefore, the PMOS transistor QP2 turns on. At this point, the constant current value flowing into the node VREF is the sum of the constant current value IS and the constant current value IS2. Therefore, the voltage value VH of the reference voltage VREF can be illustrated with the following expression.

$$VH = VTP + \sqrt{\frac{2(IS + IS2)}{\beta p}} + VTN + \sqrt{\frac{2(IS + IS2)}{\beta n}} \tag{7}$$

$$\beta p = \mu p \cdot Cox \cdot \left(\frac{Wp}{Lp}\right)$$

$$\beta n = \mu n \cdot Cox \cdot \left(\frac{Wn}{Ln}\right)$$

Here, μp and μn denote the mobility of hole and electron, respectively. Furthermore, (Wp/Lp) and (Wn/Ln) denote ratios of "channel width/channel length" of the transistors QP and QN, respectively. Cox denotes a gate oxide film capacitance per unit area. Furthermore, VTP denotes a threshold voltage of the PMOS transistor QP, and VTN denotes a threshold voltage of the NMOS transistor QN.

Next, after the output of the pulse signal SP, when the level detection circuit 2 outputs the high-level signal SP, the control signal creating circuit 15 outputs the high-level signal SP2. Therefore, the PMOS transistor QP2 turns off. At this point, the voltage value VL of the reference voltage VREF can be illustrated by the following expression.

$$VL = VTP + \sqrt{\frac{2IS2}{\beta p}} + VTN + \sqrt{\frac{2IS2}{\beta n}} \tag{8}$$

$$\beta p = \mu p \cdot Cox \cdot \left(\frac{Wp}{Lp}\right)$$

$$\beta n = \mu n \cdot Cox \cdot \left(\frac{Wn}{Ln}\right)$$

Based on Expressions (7) and (8), comparing the voltage value VH of the reference voltage VREF upon the output of the fixed signal SP and the voltage value VL of the reference voltage VREF after the output of the pulse signal SP, VH>VL.

After the output of the pulse signal SP, the voltage value of the reference voltage VREF decreases to VL. Therefore, the amplifier circuit 4 supplies the voltage ED at the same voltage level as VL to the power source voltage terminal on the high-potential side of the crystal oscillation circuit 1. In this way, when the level detection circuit 2 starts outputting the pulse signal SP at a constant frequency, the supply of the power source voltage to the crystal oscillation circuit 1 is limited. Therefore, the power consumption can be reduced.

In this way, in the oscillator of the exemplary embodiment 2, the reference voltage control signal SP2 is fixed at a constant voltage level upon the output of the fixed signal SP. Then, after the output of the pulse signal SP, the reference voltage control signal SP2 outputted after logical inversion from the control signal creating circuit 15 controls the constant current IS2. As a result, upon the output of the fixed signal SP, the voltage level of the reference voltage VREF controlled by the currents of the constant current source 7 and the constant current source 9 can be changed. As a result, the effect equivalent to the exemplary embodiment 1 of the present invention can be obtained.

Exemplary Embodiment 3

Figure 4:
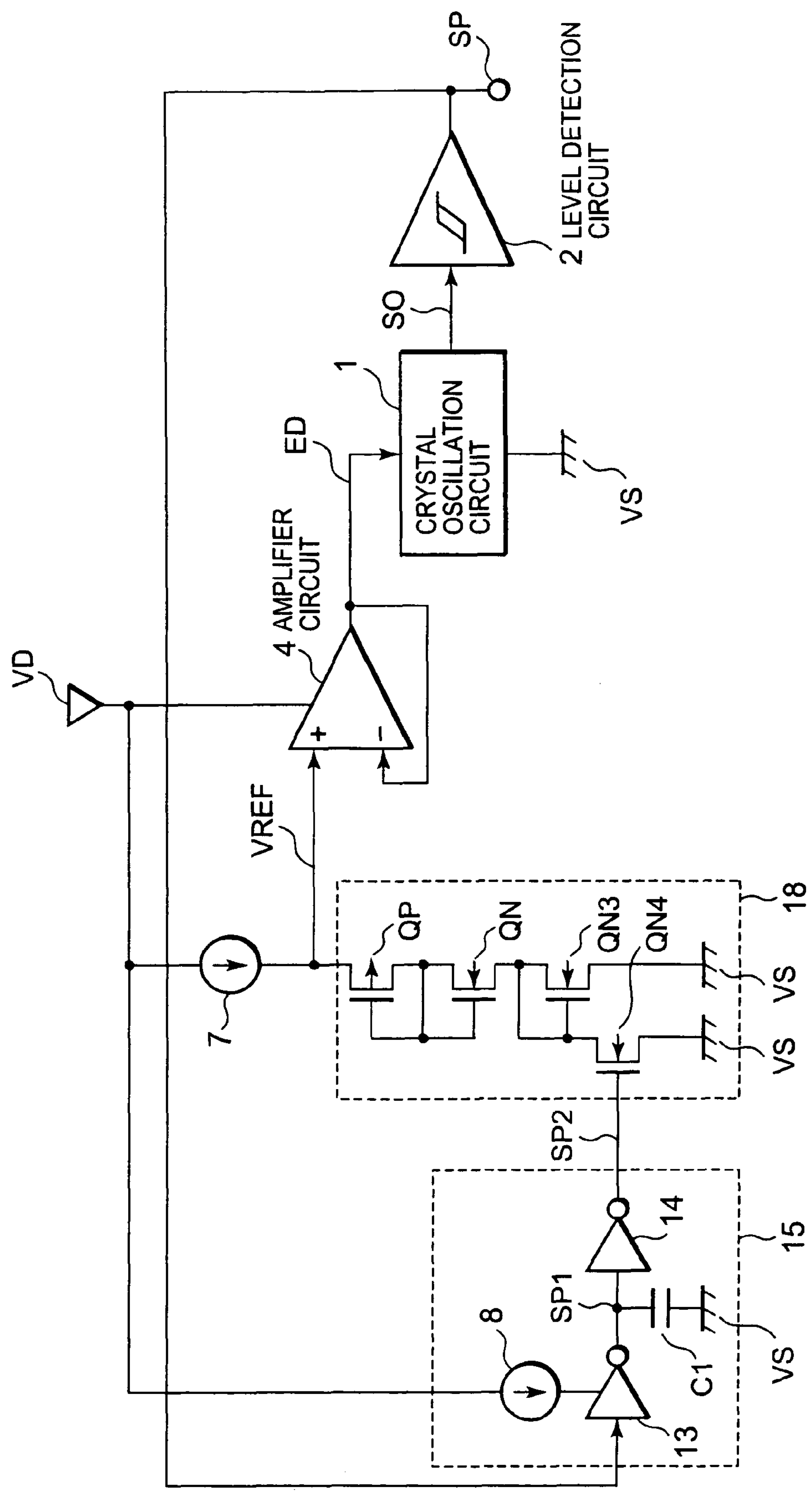
FIG. 4 is a diagram showing an oscillator according to an exemplary embodiment 3 of the present invention.

FIG. 4 shows an oscillator according to an exemplary embodiment 3 of the present invention. The circuit implements a circuit configuration in which the reference voltage generating circuit b 17 is deleted from the oscillator of the exemplary embodiment 1, and an NMOS transistor QN3 and an NMOS transistor (switching element) QN4 are newly added to the source of the NMOS transistor QN in the reference voltage generating circuit a 16 (hereinafter, referred to as a reference voltage generating circuit c 18). A source of the NMOS transistor QN is connected to a drain and a gate of the NMOS transistor QN3 and a drain of the NMOS transistor QN4. Sources of the NMOS transistors QN3 and QN4 are connected to the ground voltage terminal VS. Other circuit configurations are the same as the exemplary embodiment 1.

Next, an operation of the circuit shown in FIG. 4 will be described. By the way, the operations from the oscillation termination state to the oscillation start of the crystal oscillation circuit 1, the level detection circuit 2, and the control signal creating circuit are the same as the exemplary embodiment 1. It is assumed that the constant current value of the constant current source 7 is IS.

Upon the output of the fixed signal SP, or when the level detection circuit 2 outputs the low-level fixed signal SP, the control signal creating circuit 15 outputs the low-level signal SP2. Therefore, the NMOS transistor QN4 turns off. In this case, the voltage value VH of the reference voltage VREF can be illustrated with the following expression.

$$VH = VTP + \sqrt{\frac{IS}{\beta p}} + VTN + \sqrt{\frac{IS}{\beta n}} + VTN + \sqrt{\frac{IS}{\beta n2}} \tag{9}$$

$$\beta p = \mu p \cdot Cox \cdot \left(\frac{Wp}{Lp}\right)$$

$$\beta n = \mu n \cdot Cox \cdot \left(\frac{Wn}{Ln}\right)$$

$$\beta n2 = \mu n \cdot Cox \cdot \left(\frac{Wn2}{Ln2}\right)$$

Here, μp denotes the mobility of hole, and μn and μn2 denote the mobility of electron. Furthermore, (Wp/Lp), (Wn/Ln), and (Wn2/Ln2) denote ratios of "channel width/channel length" of the transistors QP, QN, and QN3, respectively. Furthermore, VTP denotes a threshold voltage of the PMOS transistor QP, and VTN denotes a threshold voltage of the NMOS transistors QN and QN3.

Next, after the output of the pulse signal SP, when the level detection circuit 2 outputs the high-level signal SP, the control signal creating circuit 15 outputs the high-level signal SP2. Therefore, the NMOS transistor QN4 turns on. At this point, by increasing the channel width of the NMOS transistor QN4 and decreasing the channel length, the potential difference between the source and the drain can be decreased to the extent that can be ignored. As a result, the source voltage of the NMOS transistor QN can be made equal to the ground voltage VS. At this point, the voltage value VL of the reference voltage VREF can be illustrated by the following expression.

$$VL = VTP + \sqrt{\frac{IS}{\beta p}} + VTN + \sqrt{\frac{IS}{\beta n}} \tag{10}$$

$$\beta p = \mu p \cdot Cox \cdot \left(\frac{Wp}{Lp}\right)$$

$$\beta n = \mu n \cdot Cox \cdot \left(\frac{Wn}{Ln}\right)$$

Here, μp and μn denote the mobility of hole and electron, respectively.

Furthermore, (Wp/Lp) and (Wn/Ln) denote ratios of "channel width/channel length" of the transistors QP and QN, respectively. Furthermore, VTP denotes a threshold voltage of the PMOS transistor QP, and VTN denotes a threshold voltage of the NMOS transistor QN.

Based on Expressions (9) and (10), comparing the voltage value VL of the reference voltage VREF after the output of the pulse signal SP and the voltage value VH of the reference voltage VREF upon the output of the fixed signal SP, $$VTN + \sqrt{\frac{IS}{\beta n2}}$$

the voltage value VL is smaller by this amount. After the output of the pulse signal SP, the voltage value of the reference voltage VREF decreases to VL. Therefore, the amplifier circuit 4 supplies the voltage ED at the same voltage level as VL to the power source voltage terminal on the high-potential side of the crystal oscillation circuit 1. In this way, when the level detection circuit 2 starts outputting the pulse signal SP at a constant frequency, the supply of the power source voltage to the crystal oscillation circuit 1 is limited. Therefore, the power consumption can be reduced.

In this way, in the oscillator of the exemplary embodiment 3, the reference voltage control signal SP2 is fixed at a constant voltage level during the output of the fixed signal SP. After the output of the pulse signal SP, the reference voltage control signal SP2 outputted after logical inversion from the control signal creating circuit 15 controls the reference voltage generating circuit c 18. Thus, controlling ON/OFF of the NMOS transistor QN4 included in the reference voltage generating circuit c 18 can change the voltage level of the reference voltage VREF. As a result, the effect equivalent to the exemplary embodiment 1 of the present invention can be obtained.

Although an example that the reference voltage generating circuits 16, 17, and 18 are constituted by MOS transistors has been described in the exemplary embodiments 1 to 3, the arrangement is not limited to this, and various transistors, such as a bipolar transistor, or elements including resistive components, such as a resistive element, may be used. Furthermore, as long as the resistive components can be controlled according to the reference voltage control signal SP2, the number of elements constituting the reference voltage generating circuit may be increased or decreased.

Furthermore, although an example that the oscillator is constituted by the constant current sources 7 and 8 has been described in the exemplary embodiments 1 to 3, and an example that the oscillator is further constituted by the constant current source 9 has been described in the exemplary embodiment 2, the arrangement is not limited to this, and elements that can adjust the output current, such as a resistive element, may be used.

Furthermore, although an example that the oscillator is constituted by the crystal oscillation circuit 1 has been described in the exemplary embodiments 1 to 3, the arrangement is not limited to this, and an oscillation circuit (such as an RC oscillation circuit and a ceramic oscillation circuit) including an oscillator may be used.

Furthermore, although an example that the low-level fixed signal SP is outputted before the level detection circuit 2 outputs the pulse signal SP at a constant frequency has been described in the exemplary embodiments 1 to 3, even if the fixed signal SP is a high level, the same effect can be obtained by constituting the logic structure accordingly.

Further, it is noted that Applicant's intent is to encompass equivalents of all claim elements, even if amended later during prosecution.

What is claimed is:

1. An oscillator that creates a reference voltage based on a pulse signal corresponding to an oscillation output of an oscillation circuit, and that controls a maximum voltage level supplied to the oscillation circuit according to the reference voltage, the oscillator comprising:

a control signal creating circuit that creates a first reference voltage control signal and a second reference voltage control signal based on the pulse signal; and a reference voltage generating circuit that creates a first reference voltage when receiving the first reference voltage control signal, and that creates a second reference voltage lower than the first reference voltage when receiving the second reference voltage control signal, wherein the control signal creating circuit creates the first reference voltage control signal when the pulse signal is in a first logic level, creates the second reference voltage control signal when the pulse signal is in a second logic level different from the first logic level, and prevents a transition from the second reference voltage control signal to the first reference voltage control signal when the pulse signal changes from the second logic level to the first logic level; and wherein the control signal creating circuit comprises:

a current control circuit that controls an output current;

a first capacitive element;

a first gate that receives the pulse signal and outputs a signal so that the current control circuit and the first capacitive element control a change rate of a consecutively increasing or decreasing a level of the output current; and a second gate that outputs an output to produce the first and second reference voltage control signals according to an output signal of the first gate.

2. The oscillator according to claim 1, wherein the control signal creating circuit prevents the transition from the second reference voltage control signal to the first reference voltage control signal by delaying the transition when the pulse signal changes from the second logic level to the first logic level.

3. The oscillator according to claim 1, wherein the reference voltage generating circuit comprises:

a first constant current source and a second constant current source arranged in parallel between a reference voltage terminal and a power source terminal; and a switching element that sets a connection state between the second constant current source and the reference voltage terminal when receiving the first reference voltage control signal, and sets a disconnection state when receiving the second reference voltage control signal.

4. The oscillator according to claim 1, wherein the reference voltage generating circuit includes a resistive component connected between a reference voltage terminal and a ground voltage terminal and a switching element provided in parallel with the first resistive component and having a resistance value lower than that of the resistive component, and wherein the switching element sets a disconnection state between the reference voltage terminal and the ground voltage terminal when receiving the first reference voltage control signal, and sets a connection state when receiving the second reference voltage control signal.

5. An oscillator that creates a reference voltage based on a pulse signal corresponding to an oscillation output of an oscillation circuit, and that controls a maximum voltage level supplied to the oscillation circuit according to the reference voltage, the oscillator comprising:

a control signal creating circuit that creates a first reference voltage control signal and a second reference voltage control signal based on the pulse signal; and a reference voltage generating circuit that creates a first reference voltage when receiving the first reference voltage control signal, and that creates a second reference voltage lower than the first reference voltage when receiving the second reference voltage control signal, wherein the control signal creating circuit creates the first reference voltage control signal when the pulse signal is in a first logic level, creates the second reference voltage control signal when the pulse signal is in a second logic level different from the first logic level, and prevents a transition from the second reference voltage control signal to the first reference voltage control signal when the pulse signal changes from the second logic level to the first logic level; and wherein the reference voltage generating circuit comprises:

a first reference voltage generating circuit arranged between a reference voltage terminal and a ground voltage terminal; and a second reference voltage generating circuit that includes a resistive component having a resistance lower than that of the first reference voltage generating circuit and provided in parallel with the first reference voltage generating circuit, wherein the first reference voltage generating circuit provides the first reference voltage to the reference voltage terminal, and wherein the second reference voltage generating circuit sets a disconnection state between the reference voltage terminal and the ground voltage terminal when receiving the first reference voltage control signal, and sets a connection state when receiving the second reference voltage control signal to provide the second reference voltage to the reference voltage terminal.

* * * * *